United States Patent [19]
Pikor

[11] 3,988,765
[45] Oct. 26, 1976

[54] MULTIPLE MESA SEMICONDUCTOR STRUCTURE

[75] Inventor: Adam Jan Pikor, Summit, N.J.

[73] Assignee: RCA Corporation, New York, N.Y.

[22] Filed: Apr. 8, 1975

[21] Appl. No.: 566,528

[52] U.S. Cl. .................................. 357/52; 357/56; 357/73
[51] Int. Cl.² .................. H01L 29/06; H01L 23/30
[58] Field of Search ................. 357/52, 54, 56, 73

[56] References Cited
UNITED STATES PATENTS

| | | |
|---|---|---|
| 3,410,736 | 11/1968 | Tokuyama et al. ............... 357/56 X |
| 3,506,502 | 4/1970 | Nakamura ...................... 357/52 X |
| 3,523,223 | 8/1970 | Luxem et al. ................... 357/56 X |
| 3,642,597 | 2/1972 | Sheldon ......................... 357/52 X |
| 3,767,485 | 10/1973 | Sahagun ......................... 357/56 |

*Primary Examiner*—John S. Heyman
*Attorney, Agent, or Firm*—H. Christoffersen; R. P. Williams; W. L. Muckelroy

[57] ABSTRACT

The structure is a semiconductor island with a space etched in the periphery to form two steps. The steps may be characterized as two mesas, a small mesa being located on top of a large mesa. Between the top of the small mesa and the top of the large mesa, a PN junction is located. The edge of the junction is protected by a passivation layer of relatively thick portions of glass deposited adjacent the steps.

10 Claims, 4 Drawing Figures

U.S. Patent  Oct. 26, 1976  3,988,765
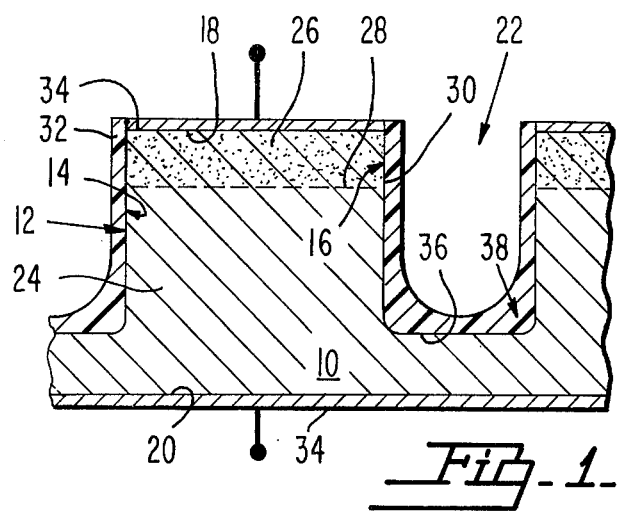
PRIOR ART
Fig. 1.
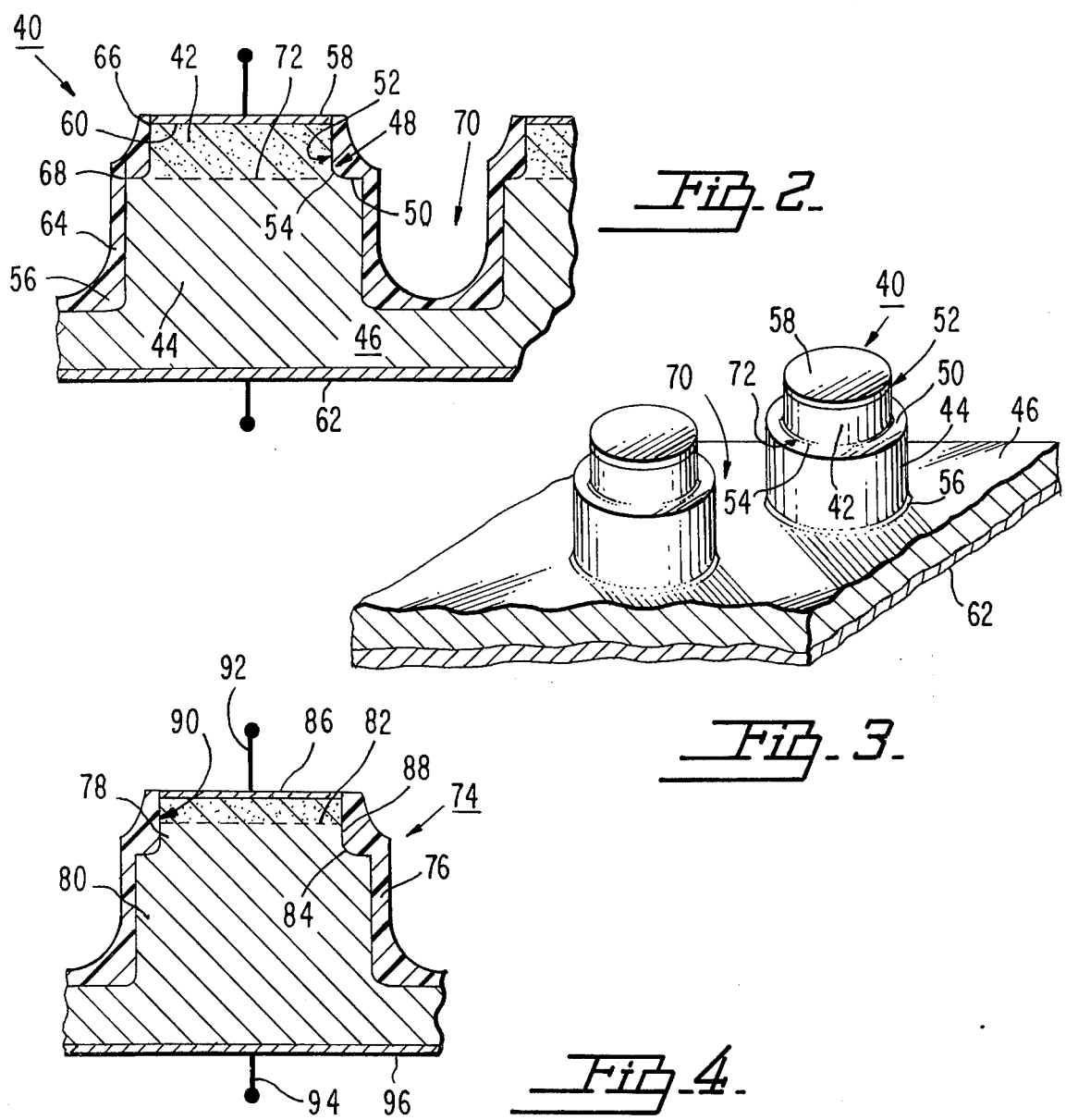
Fig. 2.
Fig. 3.
Fig. 4.

MULTIPLE MESA SEMICONDUCTOR STRUCTURE

This invention relates to coated mesa semiconductor structures for use in manufacturing such semiconductor devices as junction diodes, transistors, and integrated circuits. Specifically, the invention is well-suited for use in providing mesa transistors and diodes with protected junctions by means of a thick coating of passivating material.

The mesa configuration is generally characterized by a flat elevated top with steeply sloping sidewalls above a surrounding flat surface. The mesa may be further characterized as either cylindrical or rectangular and surrounded by a moat. The rectangular mesa configuration is used extensively in transistor semiconductor devices, the mesa containing at least one PN junction which is parallel to the top surface of the mesa and which intersects with the walls of the mesa.

The mesa structure may be produced as follows. First, a portion of a semiconductor body having a planar surface and a PN junction parallel to the surface is provided with a protective coating which is inert to a selected chemical etchant. The chemical etchant is capable of attacking the exposed portion of the semiconductor body. Immersion of the semiconductor body in the etchant produces the aforementioned mesa with the sloping sidewalls and flat tops and establishes the intersection of the PN junction with the sidewalls. One problem with devices formed in this way is that it is very difficult to place passivation layers of sufficient thickness on the sloping sidewalls at the intersection of the PN junction.

The present novel structure is a modified mesa structure which provides an adequate passivation layer at the junction. This is accomplished by making the portion of the passivation layer appositioned to the sides, which sides intersect the PN junction, thicker than the portion appositioned to other areas of the mesa. Hence, the present structure provides an abundant fill of passivating material on the sloping sidewall adjacent the PN junction.

In order to fully present the features and advantages of the invention, reference is made to illustrations in the accompanying drawing wherein:

FIG. 1 is a cross-sectional view representing a piece of a semiconductor wafer having a passivated PN junction using the structure of the prior art;

FIG. 2 is a cross-sectional view representing a semiconductor wafer having a passivated PN junction using the structure of the present invention;

FIG. 3 is an elevated view of the structure of FIG. 2 with the passivating coating removed; and FIG. 4 is a cross-sectional view of another embodiment of the present invention.

Shown in FIG. 1 is a portion of a wafer 10 having thereon a mesa 12. The mesa 12 has substantially vertical co-extensive walls 14 and 16 (walls 14 and 16 are perpendicular in the case of a rectangular mesa) and a flat intersecting top 18 surrounded by a moat, such as 22. These moats may be formed by chemically etching a semiconductor wafer of, for example, silicon.

The mesa 12 has located therein at least two semiconductor regions 24 and 26 of opposite conductivity type. For example, region 24 may be of N-type conductivity and region 26 may be of P-type conductivity, forming between them a PN junction 28.

The aforementioned PN junction 28 is oriented parallel to the top 18 and orthogonally intersects the steeply sloping walls 14 and 16 in the prior art embodiment. When a reverse bias voltage is applied across the junction 28, only a small amount of current, known as a leakage current, normally traverses the junction 28. Unfortunately, when the magnitude of the reverse bias voltage is increased beyond a determinable value, current sometimes leaks across the junction 28. Moreover, it has been previously discovered that if the intersection 30 of the junction 28 is left exposed, contaminants sometimes adhere to the mesa 12. This facilitates leakage of current across the junction 28 by the means of a bridge of ionized contaminants. This leakage of current may cause failure of the device.

In order to prevent the above problems, prior practitioners applied coatings to the mesa. Thus, a coating 32 of, for example, glass was engineered which would act as an adequate dielectric and could easily be applied to the surface of the mesa 12 in such a way that intersection 30 of junction 28 would be completely coated therewith. Various compositions were devised for the coating 32 and many schemes were ingeniously created to solve the then major problem of pinholes in the coating. However, the pinhole problem is not within the scope of this invention.

One way of solving the leakage problem is to use a space adjacent the sidewall of the mesa beneath a cantilevered oxide layer formed on the top of the mesa. However, this approach as adopted by Sheldon in U.S. Pat. No. 3,642,596 issued on Feb. 16, 1972 uses a structure significantly different from that of the present device and electrophoretic deposition to solve the problem.

The coating 32 is typically a glass. However, the invention is equally applicable to ceramic materials. Suitable coating methods, wherein the coating is applied via its own mechanical inertia are spraying precipitation from suspensions (slurries), and doctor blading.

As shown in FIG. 1 the coating 32 adheres to and is applied to the entire periphery of mesa 12. Sides 14 and 16 are coated as well as the moat 22. Uppermost portions of the coating 32 are approximately equal in thickness to lower portions. The upper half of the sidewalls 14 and 16 intersect with the PN junction 28. The intersection 30 of PN junction 28 does not have the thickest portion of the coating 32 thereon.

The inventor initially theorized that one way to solve the aforementioned problems would be to place the junction 28 at the bottom of the mesa 12 near the bottom 36 of the moat 22. This would solve the problem because there is a natural extra thick portion 38 of the coating 32 deposited in the moat 22. This, however, would entail a complete technology changeover. The present art is geared to junctions formed in the uppermost portions of the mesas such as is illustrated. The novel and unique idea developed and sucessfully used by the inventor was to reproduce one of the moats adjacent the junction whereby thicker portions of the passivating coating could be formed adjacent the PN junction.

In FIG. 2 is shown a preferred novel structure for the invention as it is incorporated into a mesa diode having a glass passivation. The diode 40 has a cylindrical shape and may be characterized as a double mesa, that is, a cylindrical mesa 42 having a small diameter sitting atop a cylindrical mesa 44 having a large diameter. Further characterization includes a wafer 46 contiguous to the mesa 44. Mesa 42 in the present example sits concentrically atop mesa 44 and, therefore, forms a corner space 48 in place of the would-be upper corner of the diode 40. This corner space 48 may be characterized as bounded by a base 50 and a wall 52. The actual space being the expanse, not occupied by the small mesa 42, located above the top of mesa 44 and below the height of the top of mesa 42. The wall 52 intersects the inside edge of the base 50.

FIG. 3 shows the mesa diode of FIG. 2 with the passivation removed. It is observed from the perspective of FIG. 3 that the base 50 may be characterized as a flat ring and that the wall 52 may be characterized as a hollow cylinder open at each end. The inside edge of the flat ring merges with the lower edge of the hollow cylinder.

In FIG. 3 base 50 and wall 52 intersect to form the bottom periphery 54 of the smaller mesa 42. Wafer 46 and mesa 44 intersect and form the bottom periphery 56 of the mesa 44. Referring again to FIG. 2, a contact 58 of metal is formed by evaporation or plating on the top 60 of the mesa 42. A contact 62 is formed on the underside of the wafer 46.

The passivation for diode 40 is a coating 64 of a glass or the like, covering the entirety of the sidewalls of the diode 40 and moat 70. The coating 64 is not of uniform thickness in all regions in the upper portion of the diode 40. Only the periphery of contact 58 has a portion of coating 64 thereon. Observing the outline of the coating 64 and moving below the top edge 66 of the mesa 42 toward the top edge 68 of mesa 44, the thickness of the coating 64 increases approximately in parabola-like fashion to a maximum value and then decreases to a minimum value (for example, 10 $\mu$m). At this point, the thickness of the coating 64 remains relatively constant until the lower portion of the diode 40 is reached. As the bottom of the moat 70 is approached, the thickness again increases in parabola-like fashion and then decreases to the minimum value. In short, the structure of the invention creates a space 48 in the upper perimeter of the diode in which a relatively thicker portion of the coating 64 can accumulate, and thereby prevent the aforementioned problem.

In the example of FIG. 3, the PN junction 72 is located at the lower edge 54 of the small mesa 42 inbetween the small mesa 42 and the large mesa 44. The PN junction 72 may, however, be located above the bottom periphery 54. However, the location of the junction 72 at the bottom periphery 54 does insure that the thick fill portions of the coating 64 (FIG. 2) above the base 50 are adjacent the PN junction 72.

The example shown in FIG. 3 illustrates the basic structure of the present invention. In the example, by way of specific example, the moat 70 has a width of 250 $\mu$m, the wall 52 has a height of 40–50 $\mu$m, and the base 50 has a width of about 50 $\mu$m. The mesa 44 is about 70 $\mu$m high. The PN junction 72 is accordingly about 40–50 $\mu$m below the bottom of the contact 58. The example is etched from a silicon wafer. The etchant comprises, for example, equal parts by volume of concentrated nitric acid ($HNO_3$), concentrated hydrofluoric acid (HF), and glacial acetic acid ($CH_3COOH$). To form the above specified shape and dimensions for the space bounded by wall 52 and base 50 the duration of the etching step is about two minutes.

One way of manufacturing the double circular mesa of FIG. 3 is to first etch into a semiconductor wafer, a grid pattern, having a depth equal to the height of the wall 52, which surrounds portions of the wafer having the size of the principal surface of the small mesa 42. This may be accomplished by use of the standard "photoresist mask and etch" technique to form a silicon dioxide etch mask and selective etching of the semiconductor exposed by the mask. Next, another mask is formed therein using the "photoresist mask and etch" technique. This mask is a plurality of areas having the diameter of the large mesa 44 and concentrically located with respect to the previously formed principal surface (top) of the mesa 42. An etchant suitable for the particular semiconductor selected produces the wall of the mesa 44 as well as moats such as 70.

Other locations for the PN junctions may be selected. FIG. 4 shows an embodiment of the invention wherein a diode 74 is comprised of a coating 76 appositioned to integral mesas 78 and 80 with a PN junction 82 located between the lower edge 84 and the top of the mesa 78. The PN junction 82 intersects the sidewalls 88 and 90. Members 92 and 94 represent electrical leads whereby an electrical signal may be applied to the PN junction 82 via contacts 86 and 96.

Although the passivation fill space (for example, space 48 at FIG. 2) is characterized as bounded by a hollow open cylinder which is merged with a flat disc, the merger need not be angular, i.e., the slope of the interface between the cylinder and the disc need not change abruptly. It may change gradually such that the principal cross section of the merged wall of the cylinder and the merged surface of the disc resembles a hyperbola (FIG. 3).

In addition to the need for providing an adequately thick coating of passivating material to the junction edge, it is sometimes required that a reliable coating of photoresist be appositioned to the junction at various stages in the process of manufacturing integrated circuits and transistors from PN junctions formed in the mesas. Accordingly, the structure of the invention as described above and illustrated is similarly adaptable by persons of ordinary skill in this art to processes for application of photoresist.

Although the present invention is graphically presented and applied to a cylindrical mesa, it is equally applicable by one of ordinary skill in this art to mesas having rectangular geometries.

I claim:
1. A structure for use in the manufacture of a semiconductor device comprising a semiconductor island, the semiconductor island comprising a single crystal semiconductor material, the island further comprising a small mesa located atop a large mesa, and a coating adjacent the island having thick portions thereof adjacent to the island in a corner space where the small mesa and the large mesa merge said thick portions being relatively thicker than portions of said coating located elsewhere.

2. The structure of claim 1 further comprising a wafer, the large mesa being located adjacent the wafer.

3. The structure of claim 2, wherein the small mesa is concentrically located atop the large mesa.

4. The structure of claim 3 further comprising a PN junction located in the small mesa wherein the PN junction intersects the small mesa at a surface thereof adjacent the space.

5. The structure of claim 4, wherein the PN junction is located inbetween the small mesa and the large mesa.

6. The structure of claim 5, wherein the coating is a protective coating for the PN junction.

7. The structure of claim 6, wherein the coating is a glass.

8. The structure of claim 7, wherein the island is comprised of silicon.

9. The structure of claim 8, wherein the wafer is comprised of silicon.

10. The structure of claim 9, wherein the wafer and the island are comprised of contiguous single crystal silicon.

* * * * *